US008212283B2

(12) United States Patent
Storasta et al.

(10) Patent No.: US 8,212,283 B2
(45) Date of Patent: Jul. 3, 2012

(54) REVERSE-CONDUCTING SEMICONDUCTOR DEVICE

(75) Inventors: Liutauras Storasta, Lenzburg (CH);
Munaf Rahimo, Uezwil (CH);
Christoph Von Arx, Olten (CH); Arnost Kopta, Zurich (CH); Raffael Schnell, Lenzburg (CH)

(73) Assignee: ABB Technology AG, Zurich (CH)

( * ) Notice: Subject to any disclaimer, the term of this patent is extended or adjusted under 35 U.S.C. 154(b) by 191 days.

(21) Appl. No.: 12/770,451

(22) Filed: Apr. 29, 2010

(65) Prior Publication Data
US 2010/0276727 A1    Nov. 4, 2010

(30) Foreign Application Priority Data

Apr. 29, 2009  (EP) ..................................... 09159009
Feb. 19, 2010  (EP) ..................................... 10154064

(51) Int. Cl.
*H01L 29/739* (2006.01)
(52) U.S. Cl. ................................ 257/133; 257/E29.197
(58) Field of Classification Search .................. 257/133, 257/139, 273, 378, E29.197
See application file for complete search history.

(56) References Cited

U.S. PATENT DOCUMENTS

| 2005/0017290 A1 | 1/2005 | Takahashi et al. |
| 2008/0093623 A1 | 4/2008 | Kono |
| 2008/0135871 A1 | 6/2008 | Ruething et al. |

FOREIGN PATENT DOCUMENTS

| EP | 0 683 530 A2 | 11/1995 |
| EP | 2 073 271 A1 | 6/2009 |
| EP | 2 086 012 A1 | 8/2009 |

OTHER PUBLICATIONS

European Search Report for EP 09159009.1 dated Sep. 2, 2009.

*Primary Examiner* — Cuong Q Nguyen
*Assistant Examiner* — Tran Tran
(74) *Attorney, Agent, or Firm* — Buchanan Ingersoll & Rooney PC

(57) ABSTRACT

A reverse-conducting semiconductor device is disclosed with an electrically active region, which includes a freewheeling diode and an insulated gate bipolar transistor on a common wafer. Part of the wafer forms a base layer with a base layer thickness. A first layer of a first conductivity type with at least one first region and a second layer of a second conductivity type with at least one second and third region are alternately arranged on the collector side. Each region has a region area with a region width surrounded by a region border. The RC-IGBT can be configured such that the following exemplary geometrical rules are fulfilled: each third region area is an area, in which any two first regions have a distance bigger (i.e., larger) than two times the base layer thickness; the at least one second region is that part of the second layer, which is not the at least one third region; the at least one third region is arranged in the central part of the active region in such a way that there is a minimum distance between the third region border to the active region border of at least once the base layer thickness; the sum of the areas of the at least one third region is between 10 and 30% of the active region; and each first region width is smaller than the base layer thickness.

25 Claims, 10 Drawing Sheets

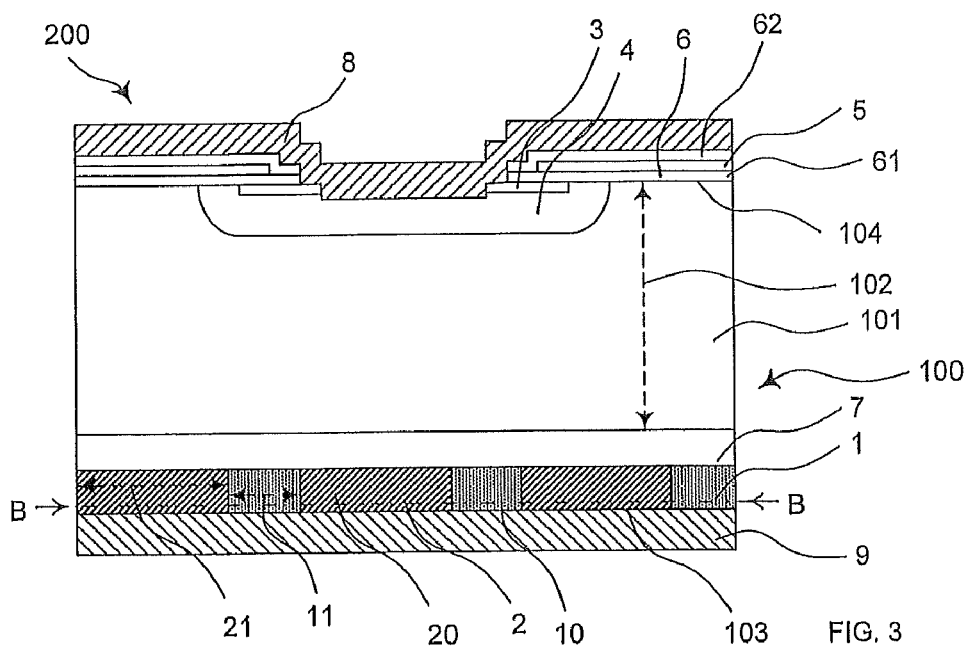
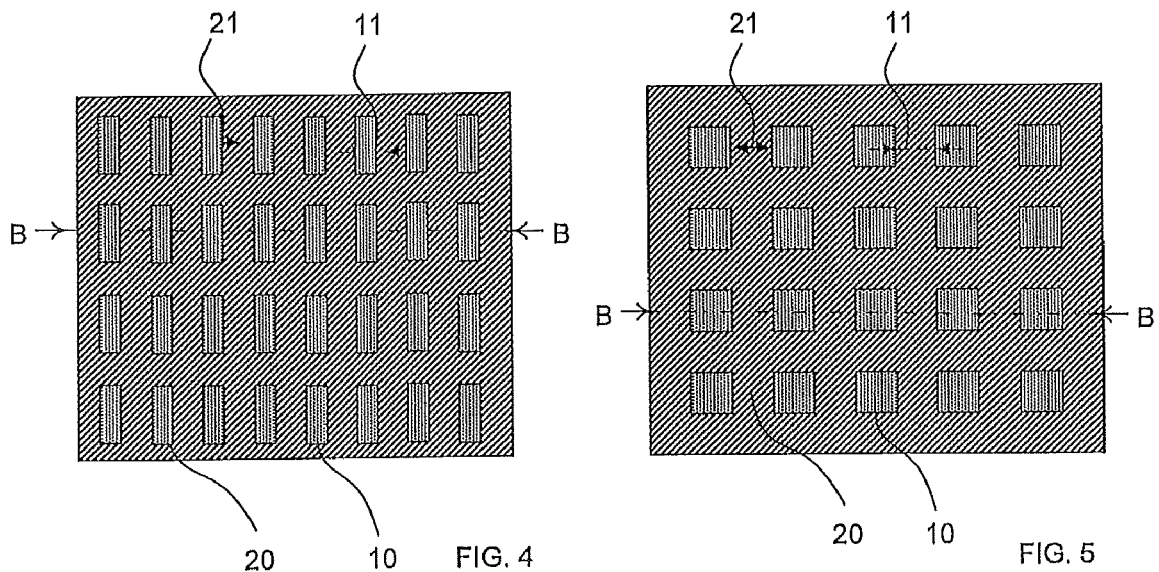

REVERSE-CONDUCTING SEMICONDUCTOR DEVICE

RELATED APPLICATIONS

This application claims priority under 35 U.S.C. §119 to European Patent Application No. 09159009.1 filed in Europe on Apr. 29, 2009 and European Patent Application No. 10154064.9 filed in Europe on Feb. 19, 2010, the entire contents of these applications being hereby incorporated by reference in their entireties.

FIELD

The disclosure relates to the field of power electronics, such as reverse-conducting semiconductor devices.

BACKGROUND INFORMATION

US 2008/0135871 A1 discloses a reverse-conducting semiconductor device 200' such as a reverse-conducting insulated gate bipolar transistor (RC-IGBT) as shown in FIG. 1. The device 200' shown in FIG. 1 includes, within one wafer 100, an insulated gate bipolar transistor with a built-in freewheeling diode. As shown in FIG. 1, such a reverse-conducting semiconductor device 200' includes an n type base layer 101 with a first main side, which is the emitter side 104 of the integrated IGBT, and a second main side, which is the collector side 103 of the IGBT and which lies opposite the emitter side 104. A fourth p type layer 4 is arranged on the emitter side 104. On the fourth layer 4, third n type layers 3 with a higher doping than the base layer 101 are arranged.

A sixth electrically insulating layer 6 is arranged on the emitter side 104 and covers the fourth layer 4 and the base layer 101 and partially covers the third layer 3. An electrically conductive fifth layer 5 is completely embedded in the sixth layer 6. Above the central part of the fourth layer 4 no third or sixth layer 3, 6 is arranged.

On this central part of the fourth layer 4, a first electrical contact 8 is arranged, which also covers the sixth layer 6. The first electrical contact 8 is in direct electrical contact to the third layer 3 and the fourth layer 4, but is electrically insulated from the fifth layer 5.

On the second main side, a seventh layer 7 formed as a buffer layer is arranged on the base layer 101. On the seventh layer 7, n type first layers 1 and p type second layers 2 are arranged alternately in a plane. The first layers 1 as well as the seventh layer 7 have a higher doping than the base layer 101.

A second electrical contact 9 is arranged on the collector side 103 and it covers the first and second layers 1, 2 and is in direct electrical contact to them.

In such a reverse-conducting semiconductor device 200', a freewheeling diode is formed between the second electrical contact 9, part of which forms a cathode electrode in the diode, the n type first layer 1, which forms a cathode region in the diode, the base layer 101, part of which forms the diode base layer, the p type fourth layer 4, part of which forms an anode region in the diode and the first electrical contact 8, which forms an anode in the diode.

An insulated gate bipolar transistor (IGBT) is formed between the second electrical contact 9, part of which forms the collector electrode in the IGBT, the p type second layer 2, which forms a collector region in the IGBT, the base layer 101, part of which forms the IGBT base layer, the fourth layer 4, part of which forms a p-base region in the IGBT, the third layer 3, which forms a n type source region in the IGBT, and the first electrical contact 8, which forms an emitter electrode.

During an on-state of the IGBT, a channel is formed between the emitter electrode, the source region and the p-base region towards the n-base layer.

The n type first layer 1 includes a plurality of fourth regions 15 with a fourth region width 16. The p type second layer 2 includes a plurality of fifth regions 25 with a fifth region width 26. The second layer 2 forms a continuous layer, in which each fourth region 15 is surrounded by the continuous second layer 2.

In FIG. 2 the first and second layer 1, 2 are shown over the whole wafer area through a cut along the line A-A from FIG. 1. This line is also indicated in FIG. 2 in order to show that the RC-IGBT 200' does not have the same structure for the first and second layer 1, 2 over the whole plane of the wafer 100. In the upper part of the figure (see line A-A) the structure of regularly arranged fourth regions 15 and fifth regions 25 is shown. FIG. 2 shows the device beyond the line A-A of FIG. 1, which line lies in the active region 110 of the device (i.e. FIG. 2 also shows the termination area 111 of the device).

In the lower part of FIG. 2, it is shown that the second layer 2 further comprises a sixth region 27 (surrounded by a dashed line in the figure), which has a larger sixth region width 28, which is larger than the width 26 of any fifth region 25. The width 28 of a sixth region 27 plus the width 16 of a fourth region 15 is 1.5 to 5 times larger than the width 26 of a fifth region 25 plus the width 16 of a fourth region 15. The sixth region 27 is arranged at the border of the active region 110 and adjacent to or at least close to the termination region 111 of the wafer.

However, both the IGBT and diode are generating losses. The sixth region 27, which is a pure IGBT area, produces the highest losses, so that the highest temperatures occur on such areas. Due to the arrangement of the sixth region 27 on the border of the wafer, the temperature distribution in the semiconductor device is therefore inhomogeneous.

Furthermore, by the excentral arrangement of the sixth region 27 the safe operating area (SOA) of the IGBT is reduced, because the sixth region 27 extends into the junction termination area, which is an electrically non-active region. By this arrangement also snap-back effects occur more easily in the on-state mode. In the designs shown in US 2008/0135871 A1 the p doped IGBT areas are made large, but the diode areas are reduced in size by that approach, thereby making the device more sensitive for snap-back effects.

SUMMARY

A reverse-conducting semiconductor device includes a freewheeling diode and an insulated gate bipolar transistor on a common wafer, part of which wafer forms a base layer of a first conductivity type with a first doping concentration and a base layer thickness. The insulated gate bipolar transistor has a collector side and an emitter side opposite to the collector side of the wafer. The base layer has a base layer thickness which is a maximum vertical distance between the collector side and emitter side of that part of the wafer with the first doping concentration. A first layer of the first conductivity type having a higher doping concentration than the first doping concentration and a second layer of a second conductivity type are alternately arranged on the collector side. A third layer of the first conductivity type, a fourth layer of the second conductivity type and an electrically conductive fifth layer formed as a gate electrode are arranged on the emitter side. The first layer includes at least one first region, wherein each first region has a first region width. The second layer includes at least one second region, wherein each second region has a second region width, and at least one third region, wherein each third region has a third region width. The first, second and third regions each include a respective region area which is surrounded by a region border. A shortest distance is a minimum length between a point within the region area of a region and a point on the region border. Each region width of a given region is defined as two times a maximum value of any shortest distance within the given region. The reverse-conducting semiconductor device also includes an electrically active region, which is an area within the wafer, which includes and is arranged below the third layer, fourth layer and fifth layer. Each third region area is an area in which any two first regions have a distance larger than two times the base layer thickness. The at least one second region is the part of the second layer which is not the at least one third region. The at least one third region is arranged in a central part of the active region such that there is a minimum distance between the third region border to the active region border of at least the base layer thickness. A sum of the areas of the at least one third region is between 10% and 30% of the active region. Each first region width is smaller than the base layer thickness.

BRIEF DESCRIPTION OF THE DRAWINGS

The subject matter of the disclosure will be explained in more detail in the following text with reference to the attached drawings, in which:

FIG. 3 shows a cross-sectional view of an exemplary reverse-conducting IGBT as disclosed herein;

FIG. 4 shows a plan view of exemplary structures of first and second regions of a reverse-conducting IGBT according to the disclosure;

FIG. 5 shows a plan view of exemplary structures of first and second regions of another reverse-conducting IGBT according to the disclosure;

The reference symbols used in the figures and their meaning are summarized in the list of reference symbols. Generally, alike or alike-functioning parts are given the same reference symbols. The described embodiments are meant as examples and shall not restrict the scope of the disclosure.

DETAILED DESCRIPTION

Figure 1:
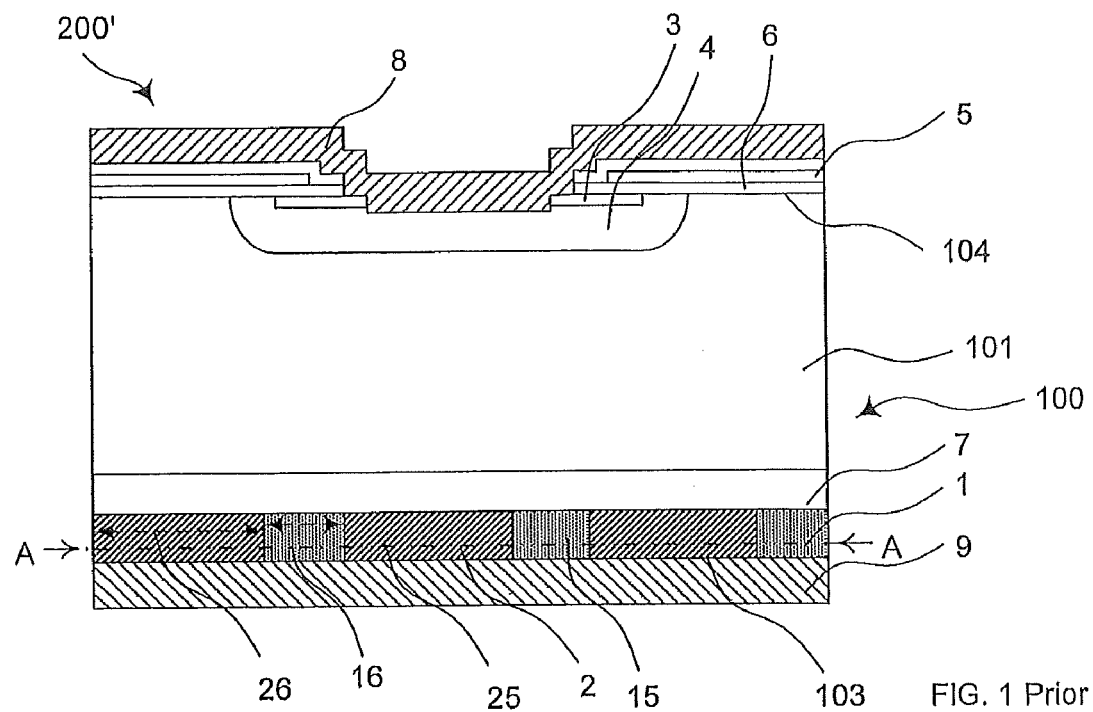
FIG. 1 shows a cross sectional view of a known reverse-conducting IGBT.
Figure 2:
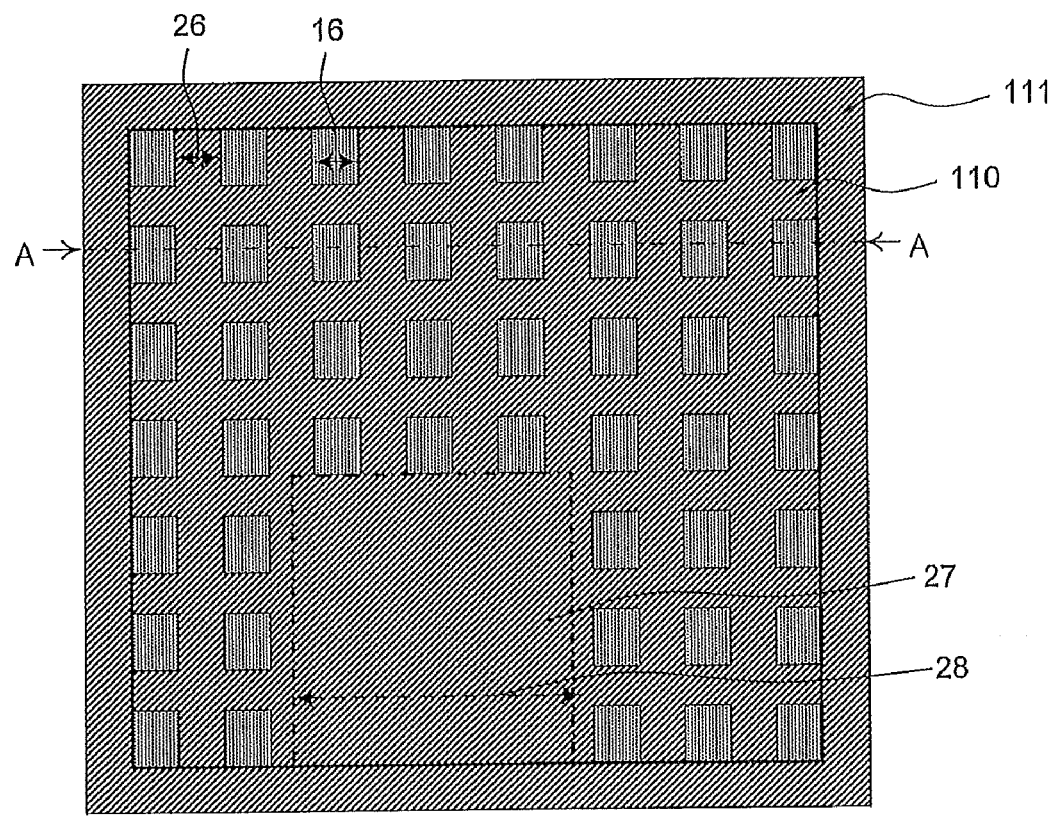
FIG. 2 shows a plan view of structures of first and second layers of a known RC-IGBT.

A reverse-conducting semiconductor device is disclosed which can possess improved electrical and thermal properties relative to known devices.

An exemplary reverse-conducting insulated gate bipolar transistor (RC-IGBT) as disclosed herein includes a freewheeling diode and an insulated gate bipolar transistor (IGBT) on a common wafer, part of which wafer forms a base layer of a first conductivity type with a first doping concentration and a base layer thickness. The insulated gate bipolar transistor includes a collector side and an emitter side, whereas the collector side is arranged opposite of the emitter side of the wafer.

The base layer thickness is, for example, a maximum vertical distance between the collector and emitter side of that part of the wafer with the first doping concentration.

A first layer of the first conductivity type and higher doping concentration than the first doping concentration and a second layer of a second conductivity type can be alternately arranged on the collector side. The first layer can include at least one or a plurality of first regions, wherein each first region has a first region width.

The second layer can include at least one or a plurality of second regions and at least one or a plurality of third regions, wherein each second region has a second region width and each third region has a third region width.

Any region (first, second or third region) can have a region width and a region area, which is surrounded by a region border.

In an exemplary embodiment, a shortest distance is a minimum length between a point within a region area and a point on the region border. In that exemplary embodiment, each region width is defined as two times the maximum value of any shortest distance within the region.

At the emitter side, a third layer of the first conductivity type, a fourth layer of the second conductivity type and an electrically conductive fifth layer formed as a gate electrode can be arranged.

The reverse-conducting semiconductor device can include an electrically active region, which active region is an area in the wafer, which includes and is arranged below any of the third layer, fourth layer or fifth layer.

The following exemplary geometrical rules can be applied in accordance with exemplary embodiments:
  each third region area is an area, in which any two first regions have a distance bigger than (i.e., larger than) two times the base layer thickness;
  the at least one second region is that part of the second layer (2), which is not the at least one third region (22);
  the at least one third region is arranged in a central part of the active region in such a way that there is a minimum distance between the third region border to the active region border of at least once the base layer thickness;
  a sum of the areas of the at least one third region is between 10 and 30% of the active region;
  each first region width is smaller than the base layer thickness.

The third region represents a pilot IGBT region, in which snap-back effects at low currents can be eliminated. A minimum distance between this third region and the border of the active region can be exploited for good thermal performance and improvement of the device SOA since the pilot IGBT does not include transition parts of the chip such as those from active to termination regions. Furthermore, by using a third region, snap-back behavior can be improved relative to distributed smaller pilot regions.

By introducing a larger third region compared to the smaller second regions, large areas of the device with shorted structures (first regions) can be maintained.

The third region is surrounded by shorted regions with alternating regions of the first and second conductivity type.

The at least one second region is that part of the second layer, which is not a third region. For a better diode area, a stripe design can be used. Connection regions may be established between the p stripe second regions and the large p third region.

The heat flux can be improved by arranging the pure IGBT area in the central part of the wafer, so that the heat can distribute in all directions and the heat distribution is more homogeneous.

Since the small first and second regions do not heavily influence the IGBT snap-back mode in line with the above design rule, their dimensions can be adjusted to achieve the desired diode area.

By the introduction of the third region with much increased dimensions compared to the first and second regions, a region can be created which is dedicated as IGBT region not operating in the diode mode. The p-type third region as a pilot region can ensure an increased IGBT area.

The first and second regions form the main shorted region in which the silicon area included is utilized in both IGBT and diode mode. These regions can also influence the main IGBT electrical properties. The third region can give more freedom to determine the IGBT to diode area ratio and decouple this design aspect from the standard approach involving the first regions only.

Figure 17:
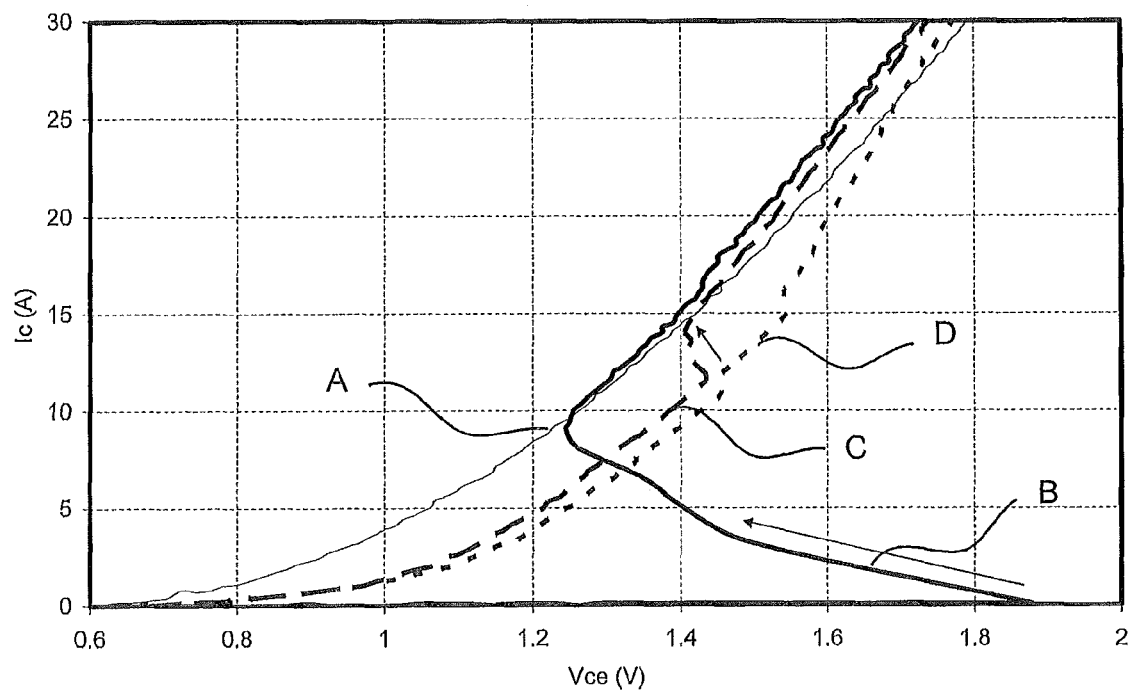
FIG. 17 shows a transition curve of a collector current IC versus a collector-emitter voltage VCE.

FIG. 17 shows a collector current $I_C$ versus a collector-emitter voltage $V_{CE}$ for on-state characteristics. Curve B shows a behavior of a known reverse conducting semiconductor device (e.g., a device with first and second regions and without a third region). Such a device shows a very strong snapback effect. The curve C is a RC-IGBT with a plurality of smaller distributed pilot IGBT third regions, which are arranged adjacent to the junction termination area with a total area of 20% of active region. Around 15 A there is an undesired sharp transition current curve. Curve D shows an RC-IGBT with a centered pilot IGBT third region of 20% of active region as disclosed herein. The transition current curve is much smoother than for the case of the distributed third regions (curve C). For comparison reasons, a curve A is included in FIG. 17 for a known IGBT. The RC-IGBT as disclosed herein can be comparable to the behavior of the known exemplary IGBT.

In an alternative exemplary embodiment, a reverse-conducting semiconductor device is disclosed, which can include a freewheeling diode and an insulated gate bipolar transistor on a common wafer, part of which wafer forms a base layer, which has a base layer thickness, wherein the insulated gate bipolar transistor includes a collector side and an emitter side. The collector side is arranged opposite of the emitter side of the wafer. The base layer thickness is the thickness as shown in FIG. 3 by the dashed line. A first layer of a first conductivity type and a second layer of a second conductivity type are alternately arranged on the collector side. The first layer can include at least one first region, wherein each first region has a first region width. The second layer can include at least one second region and a third region, wherein each second region has a second region width and the third region has a third region width. The reverse-conducting semiconductor device further includes an electrically active region. The active region is the area in which the device conducts current during an on-state. In the case of an IGBT, this can be the MOS cell with the third layer, the fourth layer, the fifth layer and the sixth region. The third region is arranged in a central part of the active region in such a way that there is a minimum distance between the third region border to the active region border of at least once the base layer width. The total area of the third region can, for example, be between 10 and 30% of the total active region. In the third region area any two first regions can have a distance bigger than two times the base layer width and each first region width can be smaller than the base layer width. In an exemplary embodiment, the width of the third region width 23 is equal or larger than once the base layer thickness 102. In another exemplary embodiment, this width can be twice the base layer thickness 102.

In FIG. 3 a first exemplary embodiment of a reverse-conducting semiconductor device 200 as disclosed herein, also referred to as a reverse-conducting insulated gate bipolar transistor (RC-IGBT), is shown. The RC-IGBT 200 includes an n type base layer 101 with a first main side, which forms the emitter side 104 of the integrated IGBT, and a second main side opposite the first main side, which forms the collector side 103 of the integrated IGBT. The base layer 101 is that part of a wafer 100, which has a first low doping concentration and is of the first conductivity type, such as the unamended doping in the finalized reverse-conducting insulated gate bipolar transistor. Alternatively, the device could also be manufactured starting from a wafer of the second conductivity type, on which the base layer 101 is created (e.g., by epitactical growing). In an exemplary embodiment, the base layer thickness 102 is the maximum vertical distance between the collector and emitter side of that part of the wafer with the first doping concentration.

A p type fourth layer 4 is arranged on the emitter side 104. At least one n type third layer 3 is also arranged on the emitter side 104 and it is surrounded by the fourth layer 4. The at least one third layer 3 has a higher doping than the base layer 101. A sixth electrically insulating layer 6 is arranged on the emitter side 104 on top of the base layer 101, the fourth and third layer 4, 3. It at least partially covers the at least one third layer 3, the fourth layer 4 and the base layer 101. An electrically conductive fifth layer 5 is arranged on the emitter side 104 electrically insulated from the at least one fourth layer 4, the third layer 3 and the base layer 101 by the sixth layer 6. The fifth layer 5 can, for example, be completely covered by the sixth layer 6.

The sixth layer 6 can include a first electrically insulating layer 61 made, for example, of a silicon dioxide, and a second electrically insulating layer 62, also made, for example, of a silicon dioxide, such as of the same material as the first electrically insulating layer 61. The second electrically insulating layer 62 covers (e.g., to any desired extent) the first electrically insulating layer 61. For an RC-IGBT 200 with a fifth layer 5 formed as a planar gate electrode as shown in FIG. 3, the first electrically insulating layer 61 can be arranged on top of the emitter side 104. In between the first and second electrically insulating layers 61, 62, which form the sixth layer 6, the fifth layer 5, which forms a gate electrode, can be embedded (e.g., completely embedded). Thus, the fifth layer 5 can be separated from the base layer 101, the fourth and third layer 4, 3 by the first electrically insulated layer 61. The fifth layer 5 can, for example, be made of a heavily doped polysilicon or a metal like aluminum.

The at least one third layer 3, the fifth layer 5 and the sixth layer 6 are formed in such a way that an opening is created above the fourth layer 4. The opening is surrounded by the at least one third layer 3, the fifth layer 5 and the sixth layer 6.

A first electrical contact 8 is arranged on the emitter side 104 within the opening so that it is in direct electrical contact to the fourth layer 4 and the third layer 3. This first electrical contact 8 can also cover the sixth layer 6, but is separated and thus electrically insulated from the fifth layer 5 by the second electrically insulating layer 62.

An n type first layer 1 and a p type second layer 2 can be arranged on the collector side 103, and the first layer 1 has a higher doping concentration than the first doping concentration of the base layer 101. The first and second layers 1, 2 can be arranged in the same plane or, alternatively, they can also be arranged in different planes, whereas the planes from the first and second layer 1, 2 are spaced from each other, for example, at least by the thickness of that layer, which is arranged farther away from the collector side 103. Devices with such first and second layers 1, 2 being arranged in different planes and their manufacturing methods are known from the European patent applications with filing numbers EP 07150162 and EP 07150165, the disclosures of which are incorporated herein by reference in their entireties.

The semiconductor device can include an electrically active region 110 and a termination region 111, which surrounds the active region 110 up to the edge of the substrate. The active region 110 is the area in which the device conducts current during on-state (in the case of an IGBT, this is the MOS cell). The active region is that area within the wafer, which includes the third layer 3 and fourth layer 4 and is arranged below the third layer 3, fourth layer 4 and fifth layer 5. The phrase below the area is meant to refer to an area arranged in the wafer between the emitter side 104 and the collector side 103, in which area any of the third layer 3, fourth layer 4 or fifth layer 5 are arranged.

In the termination area 111, first and second regions 10, 20 can be arranged, but alternatively this region may also include a single n doped region or a single p doped region. Within the exemplary termination area, on top of such first and second regions 10, 20, or only the single n or p region on the collector side 103, neither a third layer 3, a fourth layer 4 or a gate electrode is arranged.

A second electrical contact 9 is arranged on the collector side 103 and it is in direct electrical contact to the at least one first and second layers 1, 2. Typically, Ti, Ni, Au or Al are exemplary materials for the second electrical contact 9.

In an exemplary RC-IGBT 200 as disclosed herein, a diode is formed between the first electrical contact 8, which forms an anode electrode in the diode, the fourth layer 4, part of which forms an anode layer, the base layer 101, part of which forms a base layer for the diode, the n type first layer 1 and which layer forms a cathode layer, and the second electrical contact 9, which forms a cathode electrode.

In an exemplary RC-IGBT 200 as disclosed herein, an insulated gate bipolar transistor (IGBT) is formed between the first electrical contact 8, which forms an emitter electrode in the IGBT, the third layer 3, which forms a source region, the fourth layer 4, part of which forms a channel region, the base layer 101, part of which forms a base region for the IGBT, the p type second layer 2, which forms a collector layer and the second electrical contact 9, part of which forms a collector electrode.

Figure 9:
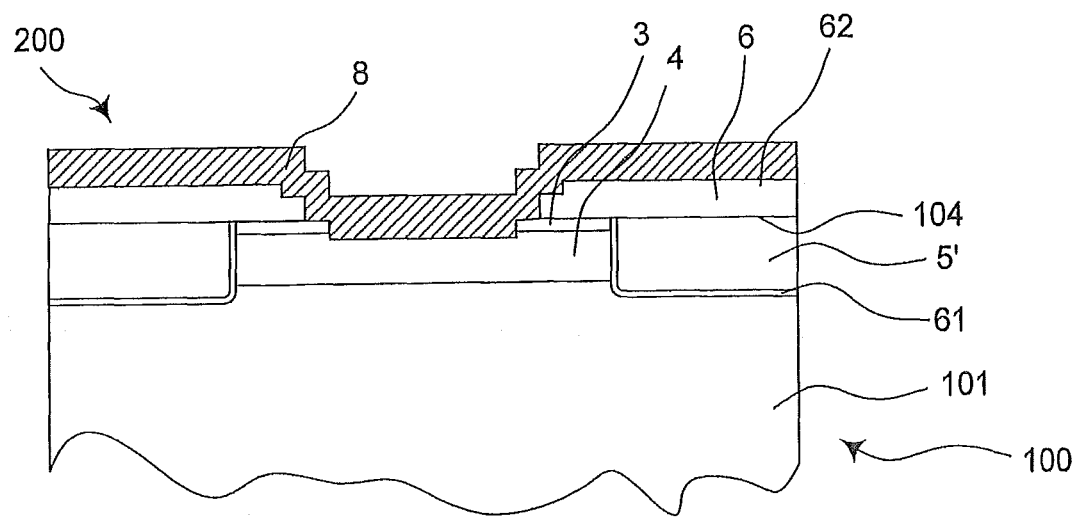
FIG. 9 shows layers on the emitter side of another exemplary reverse-conducting IGBT with trench gate electrodes as disclosed herein.

Alternatively to an exemplary RC-IGBT with a planar gate electrode, an exemplary RC-IGBT can include a fifth layer 5', formed as trench gate electrode as shown in FIG. 9. The trench gate electrode can be arranged in the same plane as the fourth layer 4 and adjacent to the third layer 3, separated from each other by a first insulating layer 61, which also separates the fifth layer 5' from the base layer 101. A second insulating layer 62 can be arranged on top of the fifth layer 5' formed as a trench gate electrode, thus insulating the fifth layer 5' from the first electrical contact 8.

The n type first layer 1 includes at least one or a plurality of first regions 10, wherein each first region 10 has a first region width 11. The first layer 1 can include a plurality of first regions 10.

The p type second layer 2 includes at least one or a plurality of second regions 20 and at least one or a plurality of third regions 22, wherein each second region 20 has a second region width 21 and the third region 22 has a third region width 23.

Any of the first, second and third regions has a region width and a region area, which is surrounded by a region border.

In an exemplary embodiment, a shortest distance is the minimum length between a point within said region area and a point on the region border. The region width can be measured in a plane parallel to the collector side 103. Each region width in this exemplary embodiment is defined as two times the maximum value of any shortest distance within said region.

FIG. 4 shows a cut through the first and second layer 1, 2 along the line B-B from FIG. 3. This line is also indicated in FIG. 4 in order to show that the RC-IGBT does not have the same structure for the first and second layer 1, 2 over the whole plane of the wafer 100. There are parts in which the first and second layer 1, 2 only includes first and second regions 10, 20 as shown in FIGS. 4 and 5 and which are also present in the FIGS. 6, 7 and 8 (e.g., along the line B-B). In other parts of the RC-IGBT 200, the first and second layer 1, 2 include a third region 22, which forms a pilot region.

Each third region is an area, in which any two first regions 10 have a distance bigger than two times the base layer thickness 102. This means that the third region 22 may be enclosed by first regions 10 which have a smaller distance to each other, but across the third region area, the distance between any two first regions 10 is larger than two times the base layer thickness 102. In other exemplary embodiments, each third region area is an area, in which any two first regions 10 have a distance bigger than, for example, 2.5 times (e.g., 3 times) the base layer thickness 102. The at least one second region is that part of the second layer 2, which is not the at least one third region 22.

The third region 22 (e.g., the p doped area), in which any two first regions 10 have a distance bigger than two times the base layer thickness 102, can be arranged in the central part of the active region in such a way that there is a minimum distance between the third region border to the active region border of at least once the base layer thickness 102, for example, twice the base layer thickness 102. The sum of the areas of the at least one third region 22 is between, for example, 10% and 30% of the active region 110. Furthermore, each first region width 11 is, for example, smaller than the base layer thickness 102.

The second regions 20 and the first regions 10 can form shorted regions. The second regions 20 are, for example, regions of the second conductivity type, which are not a third region 22. In another exemplary embodiment, at least one second region width 21 is equal to or larger than the base layer thickness 102 (for example, each second region width 21 is equal to or larger than the base layer thickness 102), and each first region width 11 is smaller than the base layer thickness 102.

In another exemplary embodiment, the total area of the second and third regions 20, 22 to total area of the wafer 100 is between, for example, 70% up to 90%. In such a device the total area of the first regions 10 to total area of the wafer 100 is between, for example, 10% up to 30%.

In a further exemplary embodiment, the sum of the areas of the at least one third region 22 is between, for example, 15 to 25% (e.g., about 20% to the active region).

Exemplary designs for the first and second regions 10, 20 are a stripe design (as shown in FIG. 4 or 5) or any suitable design The third region can be surrounded by the first and second regions, and the first and second regions can be self-contained shapes with outer shapes which enclose each other.

In such a design, the first regions 10 may be, for example, a square, a rectangular or a circular outer shape or any suitable shape (the regions being formed as rings, which enclose one another). Any appropriate design may be used for the first and second regions.

Figure 21:
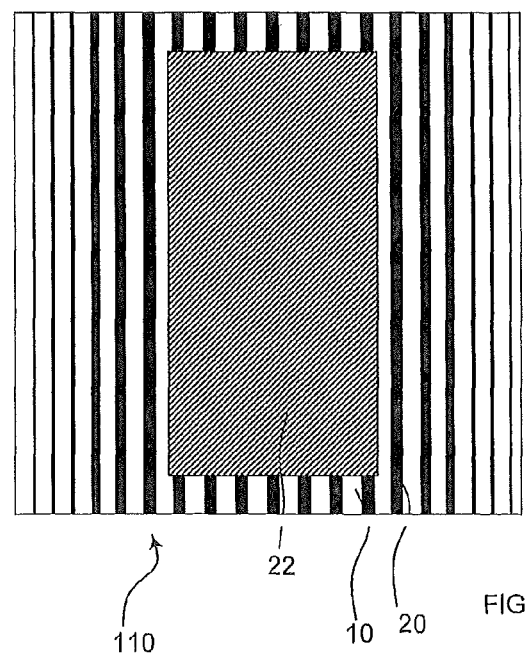

The widths 11, 21 of the shorted first and/or second regions 10, 20 can be constant over the whole wafer area so that the first and third regions 10, 20 can be arranged in a regular geometrical manner over the wafer 100 (e.g., as shown in FIGS. 4 and 5), but their widths may also vary over the wafer 100. In case of the second regions 20 being formed as stripes, the stripes can be surrounded by first regions as shown in FIGS. 4 and 5, but the first and second regions can also extend from one side of the border of the active region to the other as shown in FIG. 21.

In FIGS. 18 to 24, only the active region 110 of the device is shown. The exemplary termination region 111 can include first and second regions 10, 20 (alternatively, this region may also include an n doped region or of a p doped region), and surrounds the active region 110.

As shown in FIGS. 18 to 21, the widths 21 of the second regions 20 may vary over the wafer 100 such that the widths of the second regions decrease from that second region, which is arranged closest to the border of the at least one third region, towards the border of the active region. The second regions are shown in these figures as a black line. For such a device, the widths 11 of the first regions 10 may be constant (FIG. 18) or may vary (e.g., it may also decrease towards the border of the active region (FIG. 19)). Optionally, but not necessarily the second regions may have the same design of the region border as the third region, but with larger dimensions.

Figure 18:
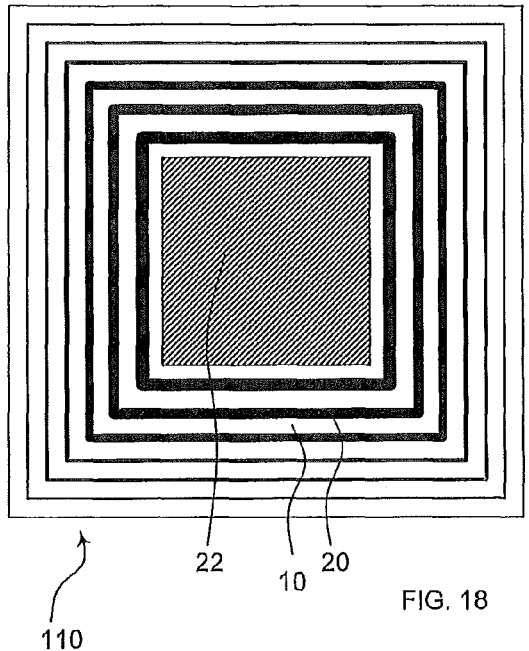
FIGS. 18-24 show plan views of exemplary structures of first layers with first regions and second layers with second and third regions of other exemplary reverse-conducting IGBT according to the disclosure.
Figure 19:
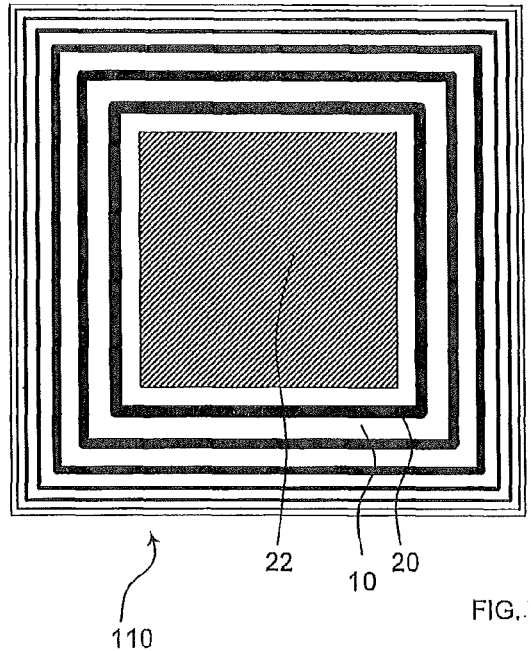
Figure 20:
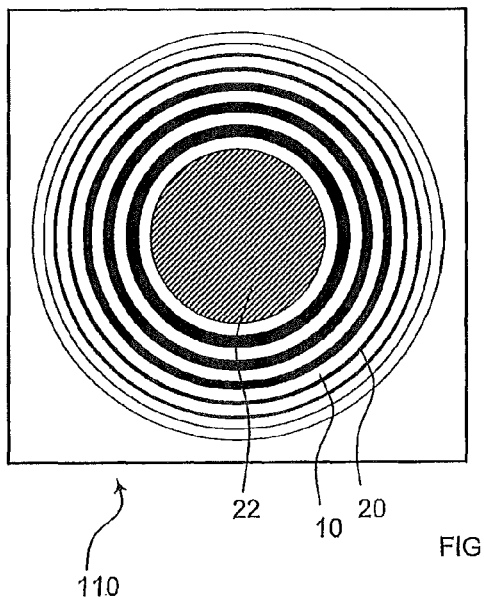

In FIG. 18, the second regions are squares, which surround the third region. FIG. 20 shows exemplarily the third and second regions as circles. FIG. 21 shows exemplarily the regions as stripes. In all exemplary cases, the first and second regions in the active region fulfill the geometrical rules given above. As shown in FIG. 21, the decrease of the widths of the second regions may be present in only one direction (e.g. the direction of the width, perpendicular to the length direction of the rectangles or stripes), whereas in another direction the width may be constant (e.g., length direction of the rectangles). The direction can be measured in a plane parallel to the collector side 103.

By the presence of a large third region as a pilot region in the device the initial snap-back is removed. As the remaining second regions have smaller dimensions, a secondary snap-back may be present when these p doped regions are turned on one after the other and cause negative resistance jumps in the on-state characteristics. By having a second region with a greater width close to the third region and by decreasing the widths of the subsequent second regions, a smooth transition can be achieved, by which the snap-back effect is further lowered or even avoided.

Figure 14:
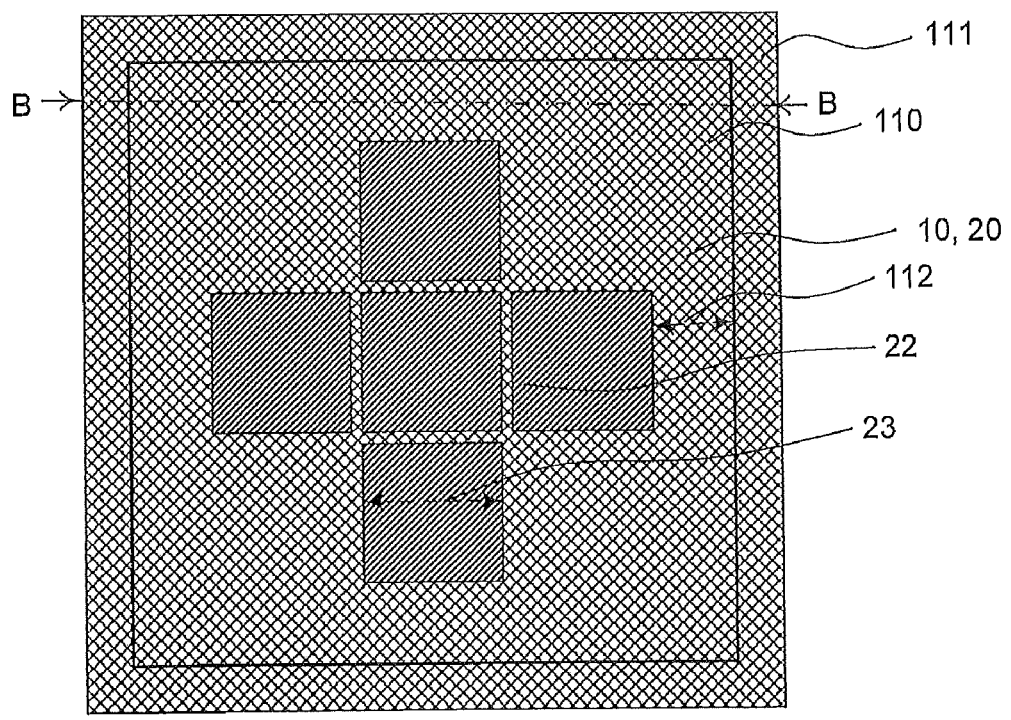
Figure 15:
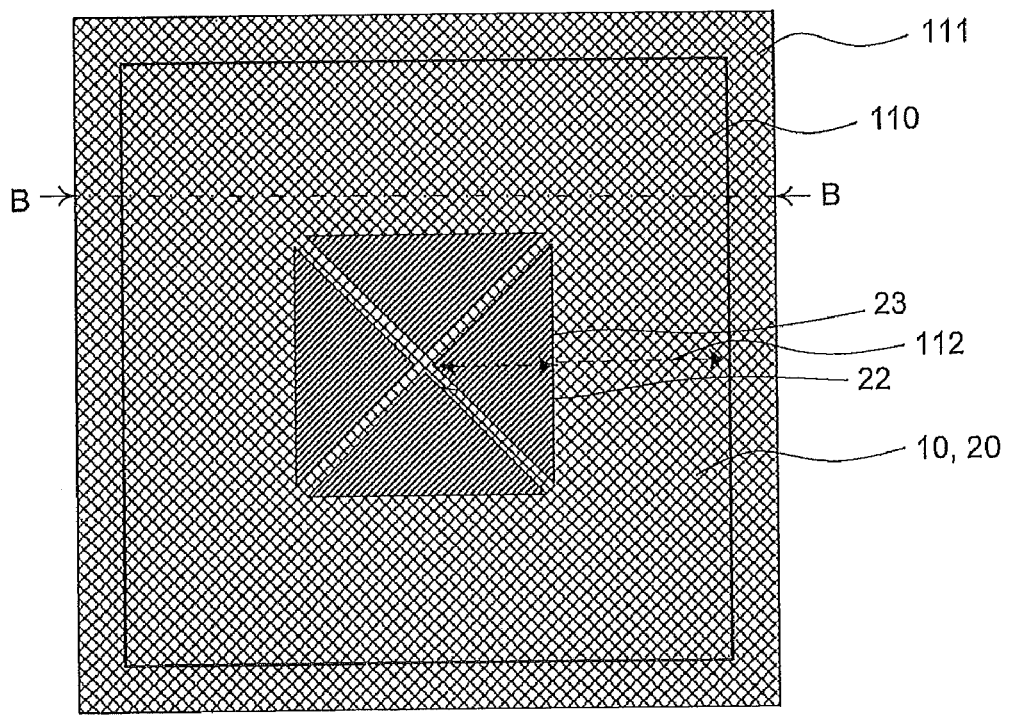
Figure 16:
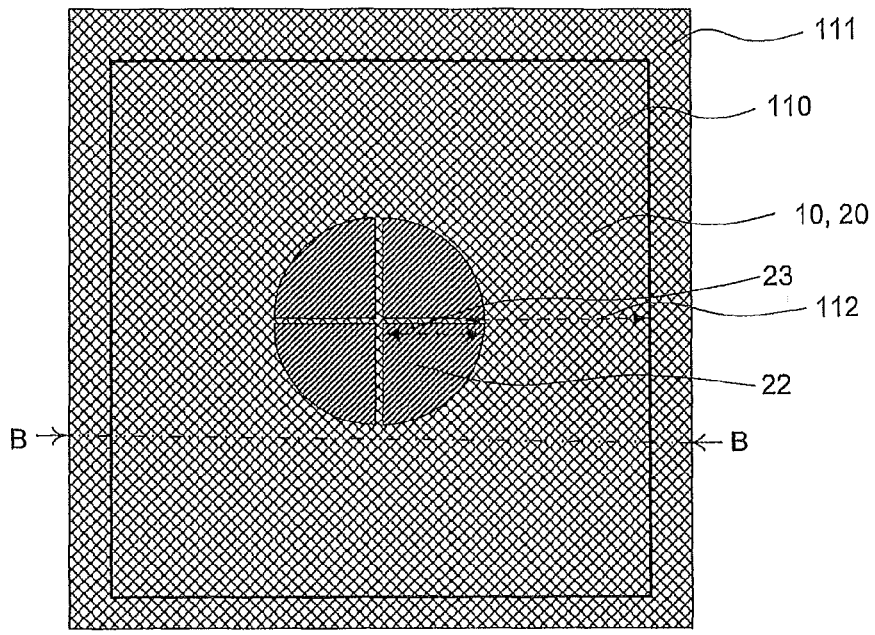

In an exemplary embodiment, the third region 22 can include a single region (as shown in the FIGS. 6, 7, 8, 11, 12 and 13). The third region may alternatively also include a plurality of regions, which are separated from each other by at most twice the base layer thickness, for example, by at most once the base layer thickness (FIGS. 14, 15, 16). In case of the third region having a plurality of regions, first regions can be arranged between two regions belonging to the third region or at least the intermediate space includes first regions (e.g., the intermediated space includes first and second regions).

In another exemplarily embodiment the first regions 10 are arranged as stripes over the wafer 100. A plurality of stripes is arranged in a row and a plurality of such rows are arranged in columns within the active region 110.

In another exemplary embodiment the third region 22 is connected to each second region 20 within the active region 110.

The third region or regions 22 has, in another exemplary embodiment, a square, rectangular, circular, star, diamond, tri-star or polygonal shape like a hexagon or another polyangular design.

Figure 6:
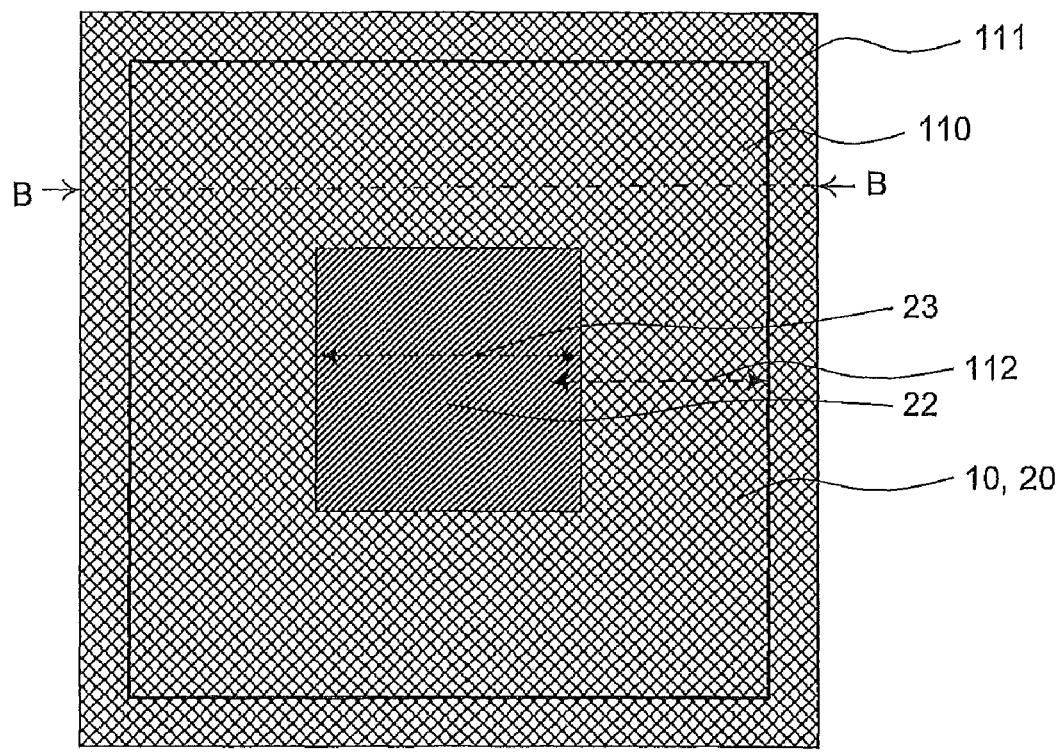
FIGS. 6-8 show plan views of exemplary structures of first layers with first regions and second layers with second and third regions of other reverse-conducting IGBT according to the disclosure.
Figure 7:
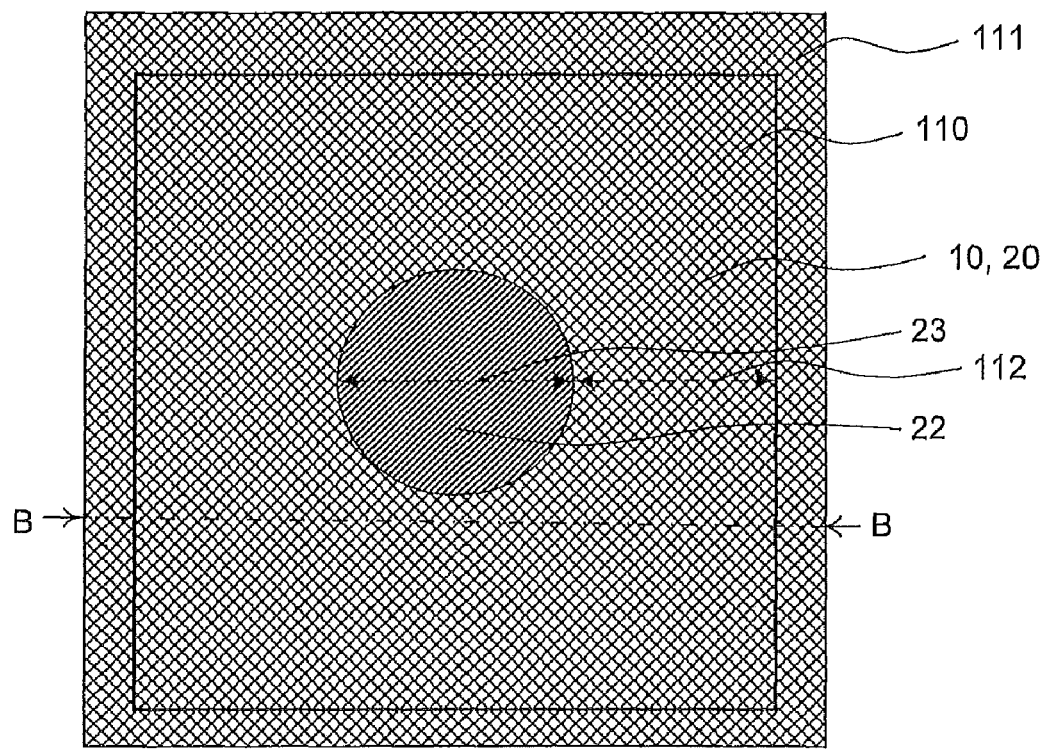
Figure 8:
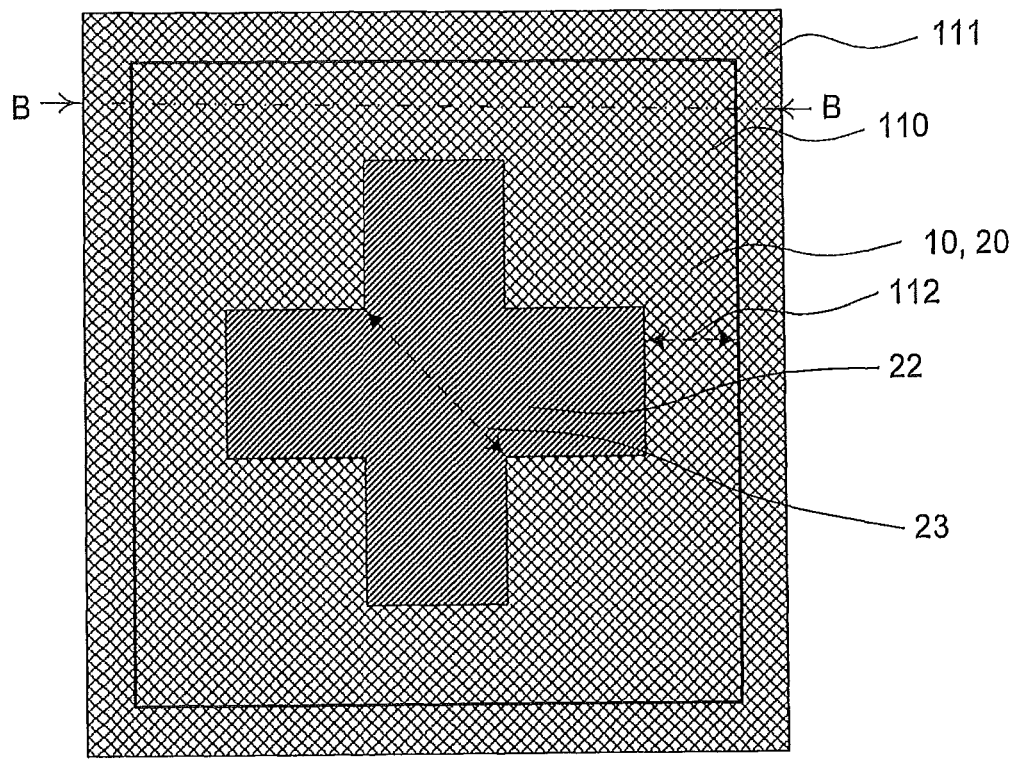

FIG. 6 shows such a third region 22 with a square shape, whereas FIG. 7 shows a third region 22 with a circular shape. In FIGS. 6 to 8, the first and second regions 10, 20 are only indicated by hatching of the area designated with 10, 20 for clarity reasons, but the hatched area is meant to be an area of alternating first and second regions 10, 20 (e.g., as shown in FIGS. 4 and 5).

An exemplary shortest distance is a minimum length between a point within the region area and a point on the region border. The maximum value of any shortest distance within the region is, for a square design (FIG. 6), the distance between the central point of the square to the middle point of any of the border lines. This is the longest distance to equalize charge during switching of the device. The region width is defined as two times this maximum value (e.g., the width is the length of the edge of the square).

For a circular shape of the third region 22 as shown in FIG. 7, the third region width 23 corresponds to the diameter of the third region (again the maximum value can be measured from the central point of the circle to any point on the border of the circular third region.

By the third region 22 having a star shape with elongated fingers (protrusions) as for example with the cross shape, the heat distribution can be improved, because the heat is produced in this IGBT area without the necessity of increasing the size of the third region 22. Star shape shall mean any central area of a region, which is surrounded by protrusions (fingers) with at least three such protrusions. A cross as shown in FIG. 8 is formed by four such protrusions. Of course, any other number of fingers other than four can be used in a star design, as three fingers in a triangle (three armed star or tri-star shape) or five or more fingers in the star design.

In an exemplary embodiment, fingers shall be understood as areas, in which the width is smaller than the length of that area. Such fingers can be formed as a cross (FIG. 8), but of course also another number of fingers than 4 can be used as three fingers in a triangle or 5 or more fingers in a star design.

FIG. 8 show the second pilot region 22 in form of a cross. For explaining what the maximum value (third region width 23) of the shortest distance is for this case, the cross is hypothetically divided into four outer rectangles and a central rectangle. A maximum value of any shortest distance between a point within the cross region to the border of the cross region exists from the middle point of the central rectangle of the cross to one of the four points, on which two adjacent outer rectangles adjoin. The third region width 23, which is two times this maximum value, is shown as a dashed line. The maximum value is the longest way an electron or hole has to flow in order to charge or discharge the region if the device is switched between on/off or vice versa.

Figure 22:
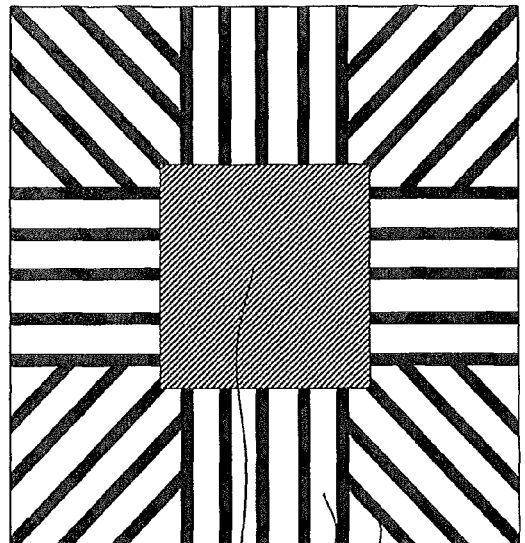

FIG. 22 shows another exemplary embodiment of an exemplary device as disclosed herein, in which the third region 22 in square design is connected to second regions 20, which extend to the border of the active region 110. In case of the device having a plurality of third regions 22, these regions 22 are interconnected to one another by second regions 20. In another exemplary embodiment, the second regions 20, which expand to the border of the active region 110, are arranged radial between the at least third region and the border of the active region. By "radial" it is meant that the second regions are arranged star like around the third region 22 such that the second regions are short connections to the border of the active region.

Figure 23:
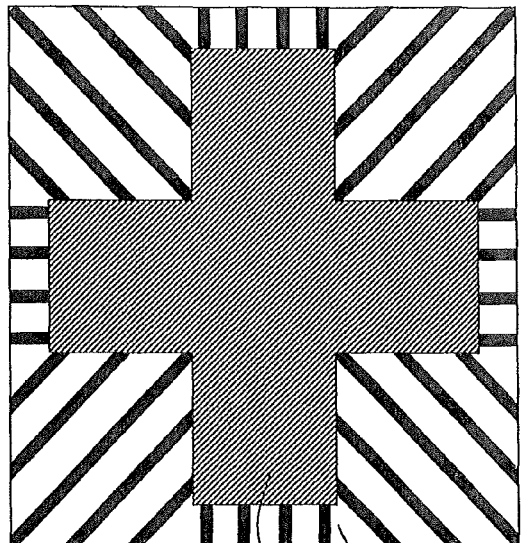
Figure 24:
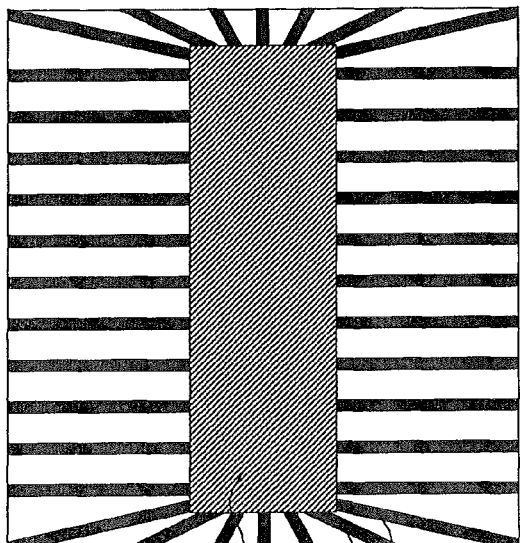

FIG. 23 shows a third region in a cross design and FIG. 24 in a stripe design. In these figures, only a part of the second regions radiate from the third region border to the active region border and thus form shortest connections. For example, in the corners of a square, rectangle or a star, the second regions extend such that the distance between the first regions does not get too large (e.g., the geometrical rules for first region distances are fulfilled).

By the presence of a large third region as a pilot region in the device, the initial snap-back is removed. Due to the smaller size of the second regions, a secondary snap-back may be present when these p doped regions are turned on one after the other and cause negative resistance jumps in the on-state characteristics, if the second regions are disconnected from the third region. By having the third region connected to second regions, and by radial extending the second regions between the third region to the border of the active region, the snap-back effect can be further lowered or even avoided.

As also shown in FIG. 3, in another exemplary embodiment, the RC-IGBT 10 may further include an n type seventh layer 7, which is arranged between the base layer 101 and the first and second layer 1, 2 respectively, and which seventh layer 7 has a higher doping concentration than the base layer 101.

The seventh layer 7 has, for example, a maximum doping concentration of at most $1*10^{16}$ cm$^{-3}$.

Figure 10:
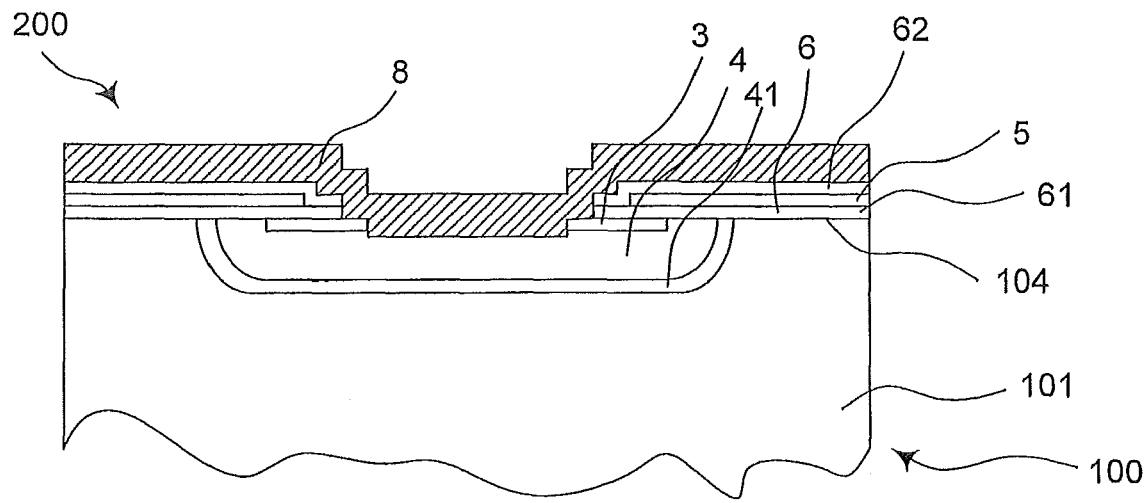
FIG. 10 shows layers on the emitter side of another exemplary reverse-conducting IGBT with an enhancement layer as disclosed herein.
Figure 11:
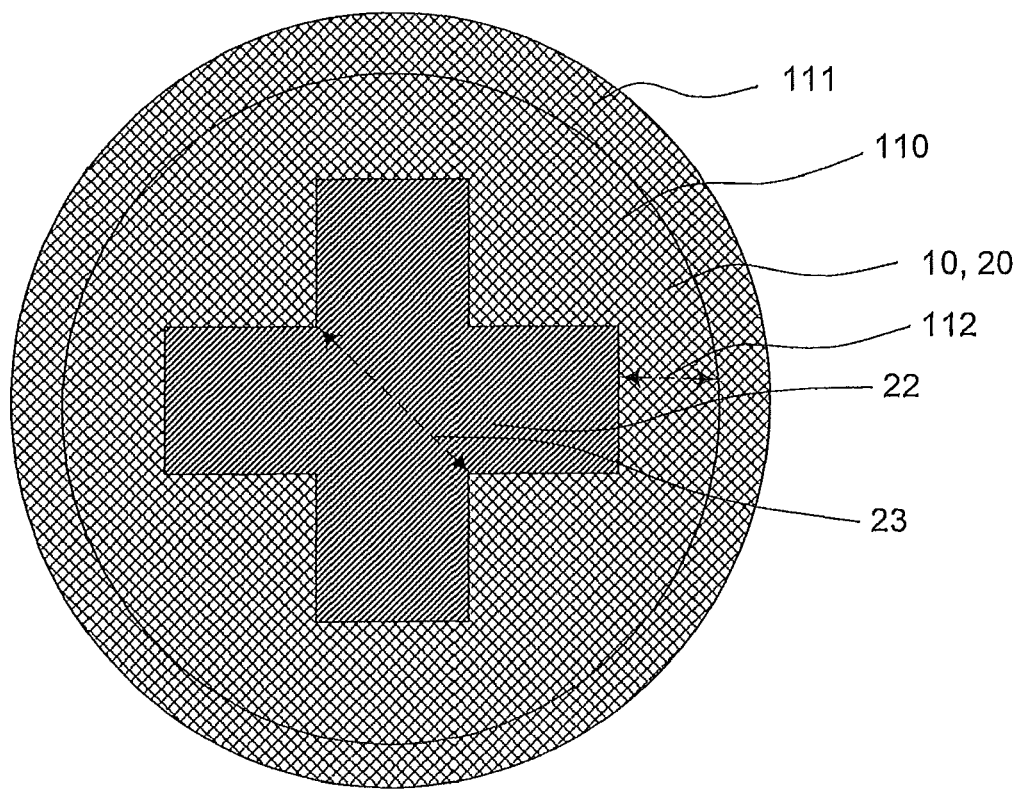
FIGS. 11-16 show plan views of structures of first layers with first regions and second layers with second and third regions of other exemplary reverse-conducting IGBT according to the disclosure.
Figure 12:
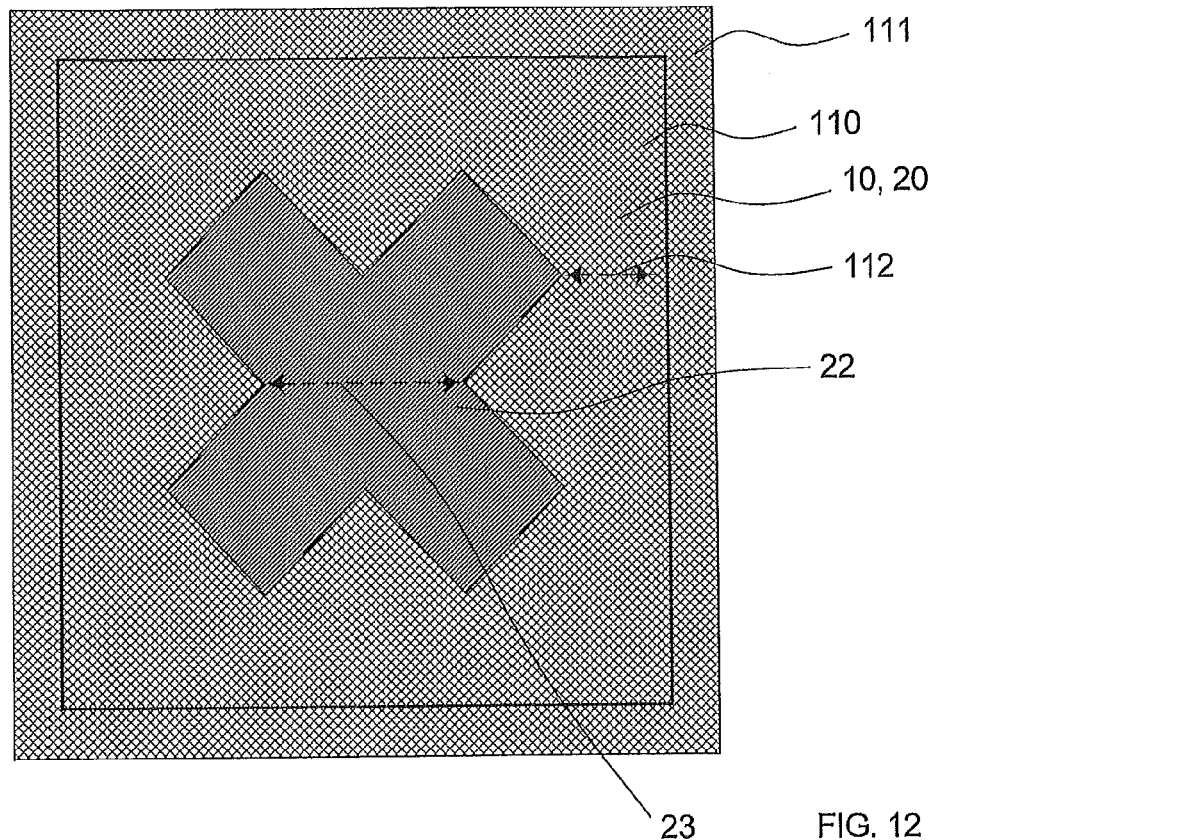
Figure 13:
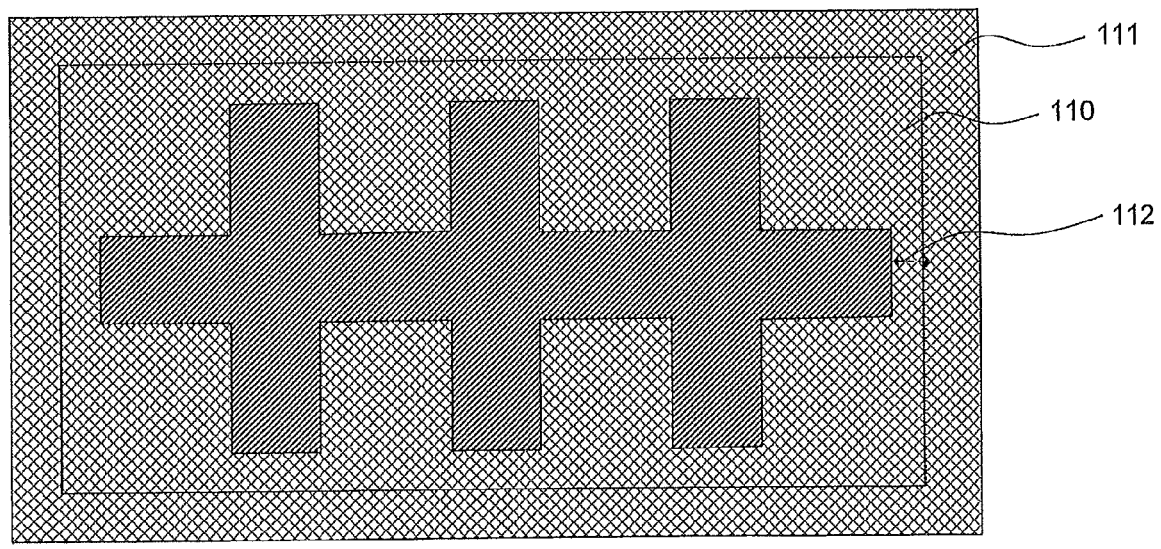

In another exemplary embodiment shown in FIG. 10, an eighth n doped layer 41, formed as an enhancement layer, is arranged between the fourth layer 4 and the base layer 101 for having lower on-state losses. The eighth layer 41 separates the fourth layer 4 from the base layer 101 and it has higher doping concentration than the base layer 101. The eighth layer 41 can be present in planar gate designs as well as in trench gate designs.

In another exemplary embodiment, the conductivity types of the layers can be switched (e.g., all layers of the first conductivity type are p type (e.g., the base layer 101) and all layers of the second conductivity type are n type (e.g., the fourth layer 4).

An exemplary reverse-conducting semiconductor device 200 as disclosed herein can, for example, be used in a converter or other desired application.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 first layer
10 first region
11 width of first region
15 fourth region
16 width of fourth region
2 second layer
20 second region
21 width of second region
22 third region
23 width of third region
25 fifth region
26 width of fifth region
27 sixth region
28 width of sixth region
3 third layer
4 fourth layer
41 eighth layer
5, 5' fifth layer
6 sixth layer
61 first electrically insulating layer
62 second electrically insulating layer
7 seventh layer
8 first electrical contact
9 second electrical contact
100 wafer
101 base layer
102 base layer width
103 collector side
104 emitter side
110 Active region
111 termination area
112 Distance between third region border to active region border
200, 200' RC-IGBT

What is claimed is:

1. Reverse-conducting semiconductor device, comprising:
a freewheeling diode and an insulated gate bipolar transistor on a common wafer, part of which wafer forms a base layer of a first conductivity type with a first doping concentration and a base layer thickness, wherein:
the insulated gate bipolar transistor has a collector side and an emitter side opposite to the collector side of the wafer;
the base layer has a base layer thickness which is a maximum vertical distance between the collector side and emitter side of that part of the wafer with the first doping concentration;
a first layer of the first conductivity type having a higher doping concentration than the first doping concentration and a second layer of a second conductivity type are alternately arranged on the collector side;
a third layer of the first conductivity type, a fourth layer of the second conductivity type and an electrically conductive fifth layer formed as a gate electrode are arranged on the emitter side;
the first layer includes at least one first region, wherein each first region has a first region width;
the second layer includes at least one second region, wherein each second region has a second region width, and at least one third region, wherein each third region has a third region width;
the first, second and third regions each including a respective region area which is surrounded by a region border;
a shortest distance is a minimum length between a point within said region area of a region and a point on said region border; and
each region width of a given region is defined as two times a maximum value of any shortest distance within said given region;
an electrically active region, which active region is an area within the wafer, which includes and is arranged below the third layer, fourth layer and fifth layer, wherein:

each third region area is an area in which any two first regions have a distance larger than two times the base layer thickness, the at least one second region being that part of the second layer which is not the at least one third region;

the at least one third region is arranged in a central part of the active region such that there is a minimum distance between the third region border to the active region border of at least the base layer thickness;

a sum of the areas of the at least one third region is between 10% and 30% of the active region; and each first region width is smaller than the base layer thickness.

2. Reverse-conducting semiconductor device according to claim 1, wherein at least one second region width is larger than the base layer thickness.

3. Reverse-conducting semiconductor device according to claim 1, wherein each third region area is an area, in which any two first regions have a distance larger than 2.5 or 3 times the base layer thickness.

4. Reverse-conducting semiconductor device according to claim 1, wherein the at least one third region has one of a square, rectangular, circular, star, diamond and hexagon shape.

5. Reverse-conducting semiconductor device according to claim 1, wherein the third region has a star shape with at least three protrusions.

6. Reverse-conducting semiconductor device according to claim 1, wherein the at least one third region is connected to at least one or each second region within the active region.

7. Reverse-conducting semiconductor device according to claim 6, wherein the at least two third regions are interconnected to each other via second regions, and at least two third regions are connected to second regions which extend to a border of the active region.

8. Reverse-conducting semiconductor device according to claim 6, wherein at least a part of the at least one second region extends radially from the at least one third region to the border of the active region.

9. Reverse-conducting semiconductor device according to claim 1, wherein the first regions are arranged as stripes over the wafer.

10. Reverse-conducting semiconductor device according to claim 9, wherein a plurality of stripes is arranged in a row and a plurality of such rows are arranged in columns within the active region.

11. Reverse-conducting semiconductor device according to claim 1, wherein the first and second regions have self-contained shapes enclosing one another.

12. Reverse-conducting semiconductor device according to claim 11, wherein the first and second regions have one of a square, rectangular and circular outer shape.

13. Reverse-conducting semiconductor device according to claim 1, comprising one of:

widths of the at least one first and/or second regions vary over the wafer; and widths of at least one first and/or second regions is constant over the wafer.

14. Reverse-conducting semiconductor device according to claim 13, wherein the widths of the second regions vary over the wafer such that the widths of the second regions decrease from the second region, which is arranged closest to the border of the at least one third region, towards the border of the active region in at least one direction.

15. Reverse-conducting semiconductor device according to claim 1, wherein a total area of the first regions to active region is between 10% up to 30%.

16. Reverse-conducting semiconductor device according to claim 1, comprising:

a seventh layer with a higher doping concentration than the base layer, which seventh layer is arranged between the base layer and the first and second layer.

17. Reverse-conducting semiconductor device according to claim 1, wherein a total area of the at least one third region is between 15% and 25% of the total active region.

18. Reverse-conducting semiconductor device according to claim 1, comprising one of:

at least one third region which consists of a single region; and at least one third region which comprises a plurality of regions which are separated from each other by at most twice the base layer thickness.

19. Reverse-conducting semiconductor device according to claim 1, wherein there is a minimum distance between the third region border to the active region border of at least twice the base layer thickness.

20. Reverse-conducting semiconductor device according to claim 1, wherein the electrically conductive fifth layer is formed by one of a trench gate electrode, and a planar gate electrode.

21. Reverse-conducting semiconductor device according to claim 1, comprising:

an eighth layer of the second conductivity type, which has a higher doping concentration than the fourth layer, arranged between the fourth layer and the base layer.

22. Reverse-conducting semiconductor device according to claim 1, wherein a total area of the at least one third region is about 20% of the total active region.

23. Reverse-conducting semiconductor device according to claim 1, comprising:

a third region which comprises a plurality of regions which are separated from each other by at most once the base layer thickness.

24. Reverse-conducting semiconductor device according to claim 6, wherein the at least one third region is a single third region and the single third region is connected to second regions which extend to a border of the active region.

25. Reverse-conducting semiconductor device according to claim 24, wherein at least a part of the at least one second region extends radially from the at least one third region to the border of the active region.

* * * * *